United States Patent
Yagasaki

(10) Patent No.: US 8,618,884 B2
(45) Date of Patent: Dec. 31, 2013

(54) HIGH-FREQUENCY SIGNAL PROCESSING DEVICE

(75) Inventor: Tomoumi Yagasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 105 days.

(21) Appl. No.: 13/247,063

(22) Filed: Sep. 28, 2011

(65) Prior Publication Data

US 2012/0098606 A1  Apr. 26, 2012

(30) Foreign Application Priority Data

Oct. 21, 2010 (JP) .................. 2010-236096

(51) Int. Cl.
*H03F 3/04* (2006.01)

(52) U.S. Cl.
USPC ............ 330/310; 330/253; 375/359; 455/126

(58) Field of Classification Search
USPC .................. 330/133, 150, 98–100, 310–311; 455/127.3, 127.4
See application file for complete search history.

(56) References Cited

U.S. PATENT DOCUMENTS

| | | | |
|---|---|---|---|
| 6,011,440 A * | 1/2000 | Bell et al. ...................... | 330/297 |
| 6,591,089 B1 | 7/2003 | Ichihara | |
| 2006/0170492 A1* | 8/2006 | Sheng-Fuh et al. ........... | 330/129 |
| 2007/0030073 A1* | 2/2007 | Tahara et al. ................. | 330/285 |

FOREIGN PATENT DOCUMENTS

| | | |
|---|---|---|
| JP | 9-266427 A | 10/1997 |
| JP | 2001-86010 A | 3/2001 |
| JP | 2003-309435 A | 10/2003 |

* cited by examiner

*Primary Examiner* — Robert Pascal
*Assistant Examiner* — Khiem Nguyen
(74) *Attorney, Agent, or Firm* — Mattingly & Malur, PC

(57) ABSTRACT

Disclosed is a high-frequency signal processing device capable of reducing transmission power variation and harmonic distortion. For example, the high-frequency signal processing device includes a pre-driver circuit, which operates within a saturation region, and a final stage driver circuit, which operates within a linear region and performs a linear amplification operation by using an inductor having a high Q-value. The pre-driver circuit suppresses the amplitude level variation of a signal directly modulated, for instance, by a voltage-controlled oscillator circuit. Harmonic distortion components (2HD and 3HD), which may be generated by the pre-driver circuit, are reduced, for instance, by the inductor of the final stage driver circuit.

5 Claims, 12 Drawing Sheets

FIG. 4

| OSCILLATION SECTION ELEMENT CIRCUIT | AMPLITUDE VARIATION |
|---|---|
| VCO CORE | +2.31 TO -2.37 dB |
| VCO BUFFER | +2.37 TO -2.07 dB |
| WHOLE OSCILLATION SECTION | +4.68 TO -4.44 dB |

FIG. 7

| MOS | Wg | Lg | IDS |
|---|---|---|---|
| M1 | 38.4um | 0.16um | 0.27mA |
| M2 | 38.4um | 0.16um | 0.27mA |
| M3 | 153.6um | 0.50um | 0.53mA |
| M4 | 96.0um | 0.16um | 2.50mA |
| M5 | 96.0um | 0.16um | 2.50mA |
| M6 | 96.0um | 0.16 um | 2.50mA |
| M7 | 96.0um | 0.16um | 2.50mA |
| M8 | 19.2um | 0.16um | 0.50mA |
| M9 | 28.8um | 0.50um | 0.10mA |
| M10 | 28.8um | 0.50um | 0.10mA |
| M11 | 144.0um | 0.50um | 0.50mA |
| M12 | 28.8um | 0.50um | 0.10 mA |

HIGH-FREQUENCY SIGNAL PROCESSING DEVICE

CROSS-REFERENCE TO RELATED APPLICATIONS

The disclosure of Japanese Patent Application No. 2010-236096 field on Oct. 21, 2010 including the specification, drawings, and abstract is incorporated herein by reference in its entirety.

BACKGROUND

The present invention relates to a high-frequency signal processing device, and more particularly to a technology that is effective when applied to a high-frequency signal processing device that amplifies power after performing direct modulation on a voltage-controlled oscillator circuit.

A transmission power correction circuit described, for instance, in Japanese Unexamined Patent Publication No. 2001-86010 can overcome a problem where transmission power fails to comply with a standard due, for instance, to transmission circuit gain changes with temperature and variability of parts. A low-cost multistage amplifier described, for instance, in Japanese Unexamined Patent Publication No. Hei 9 (1997)-266427 suppresses changes in frequency characteristics, which are caused by switching between a linear operation and a limiting operation. A small-size high-frequency amplifier described, for instance, in Japanese Unexamined Patent Publication No. 2003-309435 not only reduces the scale of circuitry, but also provides high efficiency by exercising the distortion compensation function of a distortion compensation circuit.

SUMMARY

In recent years, a wireless IC (high-frequency signal processing devices) compliant with the IEEE 802.15.4 (ZigBee (registered trademark)) standard has become widespread. The wireless IC provides "over-the-horizon control" and "bidirectional communication." Therefore, it is particularly expected that the wireless IC will be used in place of an infrared remote controller. The ZigBee (registered trademark) standard states, for example, that a transmission power of −3 dBm or higher and an out-of-band harmonic of −43 dBm or lower be used. However, when, for instance, an infrared remote controller is put to actual use, excessive transmission power results in battery exhaustion. Further, if the transmission power varies, the maximum communication distance varies. It is therefore preferred that the transmission power variation be reduced, for instance, to 0 dBm±3 dB. Moreover, it is preferred that harmonic distortion (HD) (second harmonic distortion (2HD) and third harmonic distortion (3HD) in particular) be reduced, for instance, to −47 dBm or less in consideration, for instance, of changes during actual use. In a power amplifier circuit, however, there is generally a trade-off between a decrease in the transmission power variation and a decrease in the harmonic distortion (HD).

Meanwhile, the ZigBee (registered trademark) standard stipulates the use of a modulation method called "OQPSK with half-sine pulse shaping." This modulation method uses a combination of an OQPSK (offset quadrature phase shift keying) modulator and a half-sine pulse shaping filter. This modulation method can also be implemented by well-known IQ orthogonal modulation. To reduce the power consumption and the circuit area, however, it is beneficial to use a direct modulation method that performs direct modulation on a voltage-controlled oscillator (VCO) circuit and amplifies the resulting output with a power amplifier circuit. When, for instance, the VCO circuit is controlled to provide FSK (frequency shift keying) (called MSK (minimum shift keying)) modulation having a modulation index of 0.5, an equivalent of the aforementioned "OQPSK with half-sine pulse shaping" method is implemented.

When, in particular, the above-described direct modulation method is used, the amplitude variation in an oscillation section (a VCO and its output buffer) may increase. In some cases, it is anticipated that the variation in the oscillation section only might exceed the aforementioned range of ±3 dB. Therefore, the power amplifier circuit installed downstream of the oscillation section is affected not only by the aforementioned trade-off but also by input variation caused by the oscillation section. Hence, it is increasingly difficult to reduce both the transmission power variation and the harmonic distortion.

The distortion characteristics of the power amplifier circuit may be suppressed, for instance, by installing a two-stage amplifier circuit as described in Japanese Unexamined Patent Publication No. 2003-309435, letting a first-stage amplifier perform a class A operation to suppress the distortion characteristics, and causing a second-stage amplifier to serve as a class AB or class B amplifier. The distortion characteristics do not relate to harmonic distortion (HD), but relates to intermodulation (IM) distortion. The method described in Japanese Unexamined Patent Publication No. 2003-309435 is effective for suppressing the intermodulation distortion that occurs in the vicinity of a main signal band, but is not always optimum for the harmonic distortion components of a carrier. Further, when the output of a VCO is coupled to the input of the amplifier circuit as described in connection with the earlier mentioned direct modulation method, the variation in the output amplitude of the VCO is reflected in the output of the amplifier. Therefore, it is necessary to take some measures against such variation.

Meanwhile, there is a well-known method for suppressing the variation in the transmission power of the power amplifier circuit. In this method, the output end of the power amplifier circuit is provided with a power detector. Various parameters (e.g., the supply voltage of the power amplifier circuit) are changed in accordance with a level detected by the power detector to suppress the power variation. However, when this method is used, it is anticipated, for example, that the area and cost will be increased by the addition of the power detector, and that power loss will be caused by the input impedance of the power detector. In addition, if the amplitude of the oscillation section becomes excessive as mentioned earlier, significant harmonic distortion may occur.

As an alternative, a method of limiting the input amplitude may be employed as described in Japanese Unexamined Patent Publication No. Hei 9 (1997)-266427. This method adjusts the biases of an attenuator and an amplifier to switch between a constant output operation (limiting operation) and a linear amplification operation. Further, this method suppresses changes in the frequency characteristics of the transmission power, which are caused by the above-mentioned switching. However, the limiting operation should be avoided because it generates harmonic distortion components (third-order, fifth-order, and other high-order harmonic distortion components), thereby increasing the amount of out-of-band spurious emissions during high-frequency communication. It is also anticipated that the addition of the attenuator may increase the area of a chip. It should be noted, however, that this method is considered to be very effective if the harmonic distortion components can be successfully suppressed.

The present invention has been made in view of the above circumstances and provides a high-frequency signal processing device capable of reducing transmission power variation and harmonic distortion. These and other advantages and novel features of the present invention will become apparent from the following description and accompanying drawings.

A representative embodiment of the invention disclosed in this document is outlined below.

According to the representative embodiment of the present invention, there is provided a high-frequency signal processing device including a first amplifier circuit and a second amplifier circuit, which is disposed downstream of the first amplifier circuit. These amplifier circuits amplify a transmission signal. The first amplifier circuit operates in a so-called saturation region, receives a first input signal, which is phase-modulated or frequency-modulated, and performs a limiting operation by using a first inductor as a load. The second amplifier circuit operates in a so-called linear region, receives a signal output from the first amplifier circuit, and performs a linear amplification operation by using a second inductor as a load. The second inductor has a higher Q-value than the first inductor.

Even when the voltage level of the first input signal varies, the above-described configuration permits the first amplifier circuit to suppress such variation. Further, harmonic distortion components, which may be generated by the first amplifier circuit, can be reduced when the second amplifier circuit performs a linear amplification operation based on a high Q-value. This makes it possible to reduce transmission power variation and harmonic distortion. The amplitude level of the first input signal may vary particularly during the use of the direct modulation method based on a voltage-controlled oscillator circuit. Therefore, especially valuable advantages are obtained in such an instance.

In short, the representative embodiment of the invention disclosed in this document is advantageous as it makes it possible to reduce transmission power variation and harmonic distortion in a high-frequency signal processing device.

BRIEF DESCRIPTION OF THE DRAWINGS

FIG. 4 is a table showing examples of numerical values representing the amplitude variation of an oscillation section shown in FIG. 1;

FIG. 7 is a table showing a design example indicative of the size and source-drain current of each transistor in the power amplifier section shown in FIG. 6;

DETAILED DESCRIPTION

Figure 1:
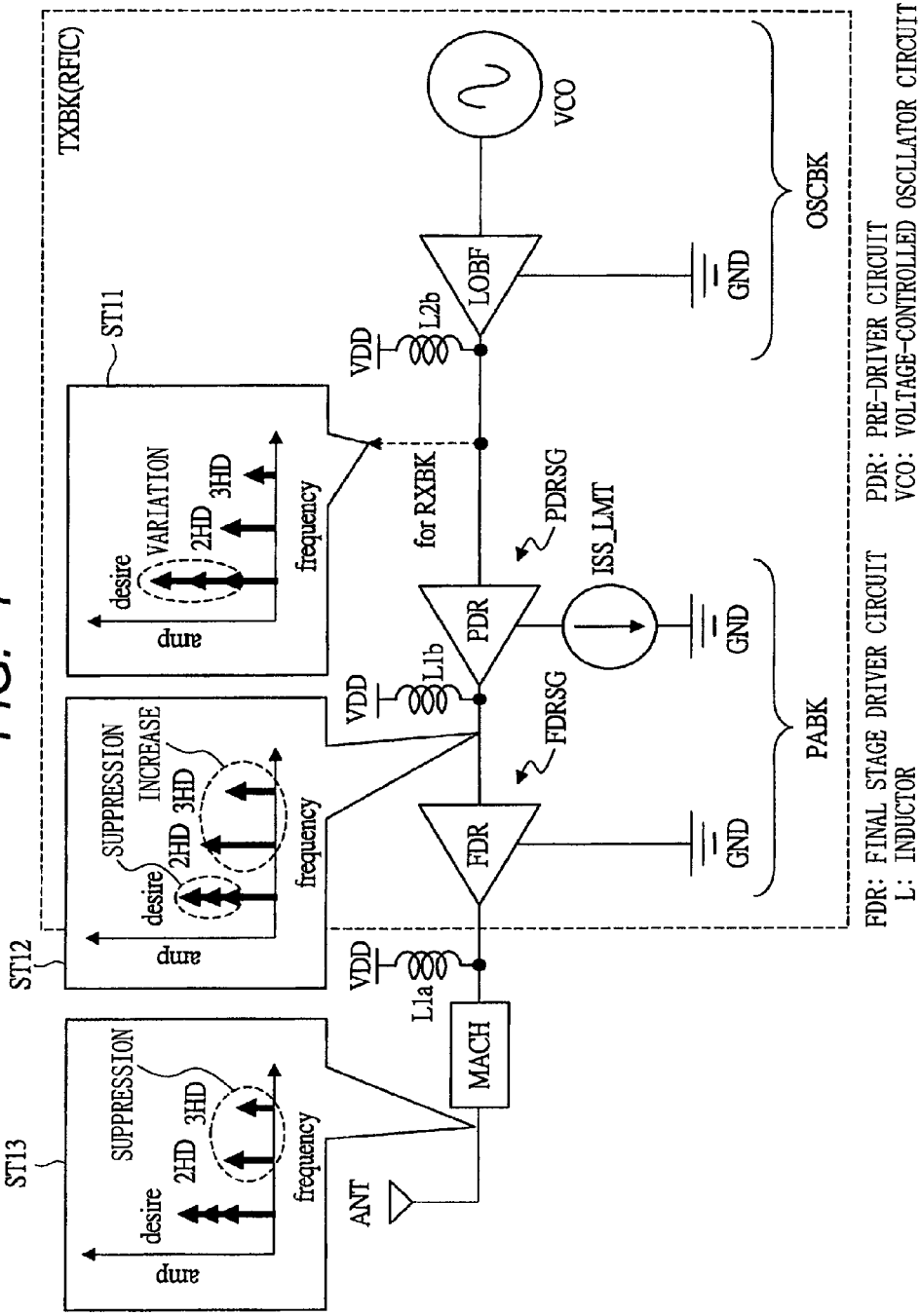
FIG. 1 is a schematic circuit block diagram illustrating an example configuration of essential parts of a high-frequency signal processing device according to an embodiment of the present invention.

In the embodiments described below, if necessary for convenience, the present invention is explained by dividing it into a plurality of sections or embodiments. However, unless otherwise explicitly stated, these sections or embodiments are not irrelevant to each other. There exists such a relationship that, for example, one section or embodiment is a modification, a detailed description, or a complementary explanation of a part or the whole of another section or embodiment. Further, in the embodiments described below, when the number of elements and the like (including, for instance, the number of pieces, numerical values, amounts; and ranges) are referred to, unless otherwise particularly specified or the number is apparently limited to a specified number in principle, the number is not limited to the specified number and may be set to a value higher or lower than the specified number.

Furthermore, in the embodiments described below, it is obvious that components (including element steps) are not always indispensable unless otherwise stated or except the case where the components are apparently indispensable in principle. Similarly, in the embodiments described below, when, for instance, the shapes of the components and the positional relationship between the components are mentioned, the substantially approximate or similar shapes and the like are included therein unless otherwise stated or except the case where it is conceivable that they are apparently excluded in principle. The same holds for the above-mentioned numerical values and ranges.

Moreover, circuit elements included in each functional block of the embodiments are not limited in particular, but are formed over a semiconductor substrate of single crystal silicon or the like by using a known integrated circuit technology for a CMOS transistor (complementary MOS transistor) or the like. Although a MOSFET (Metal Oxide Semiconductor Field Effect Transistor) (abbreviated as a MOS transistor) is used in the embodiments as an example of a MISFET (Metal Insulator Semiconductor Field Effect Transistor), a nonoxide film is not excluded as a gate insulating film. The embodiments of the present invention will now be described in detail in accordance with the accompanying drawings. In all the drawings for describing the embodiments, identical components are basically designated by the same reference numerals, and the redundant description thereof is omitted.

<<Configuration and Operation of High-Frequency Signal Processing Device (Essential Parts)>>

Figure 2:
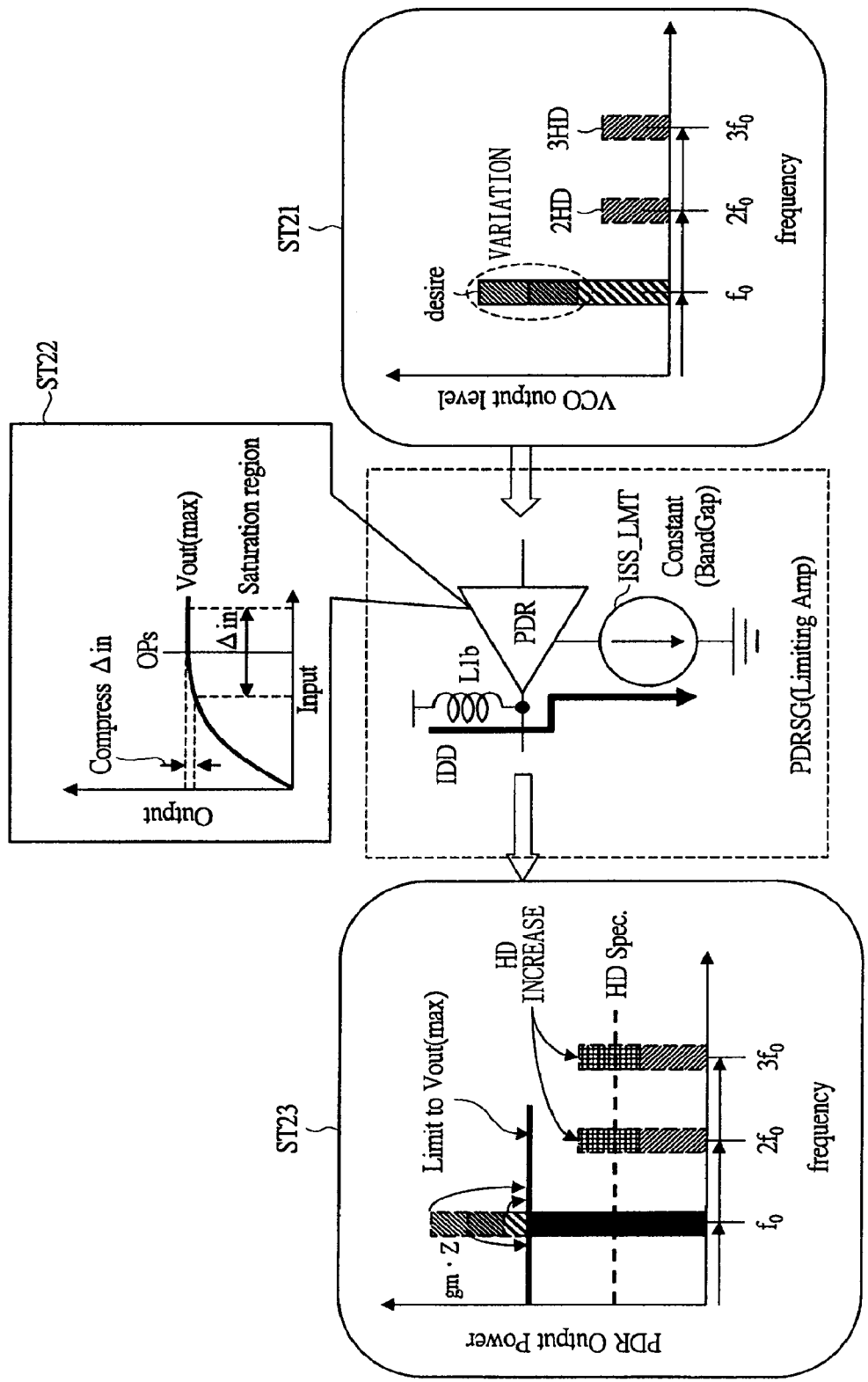
FIG. 2 is a conceptual diagram illustrating the operating principle of the pre-driver stage of a transmission block shown in FIG. 1.
Figure 3:
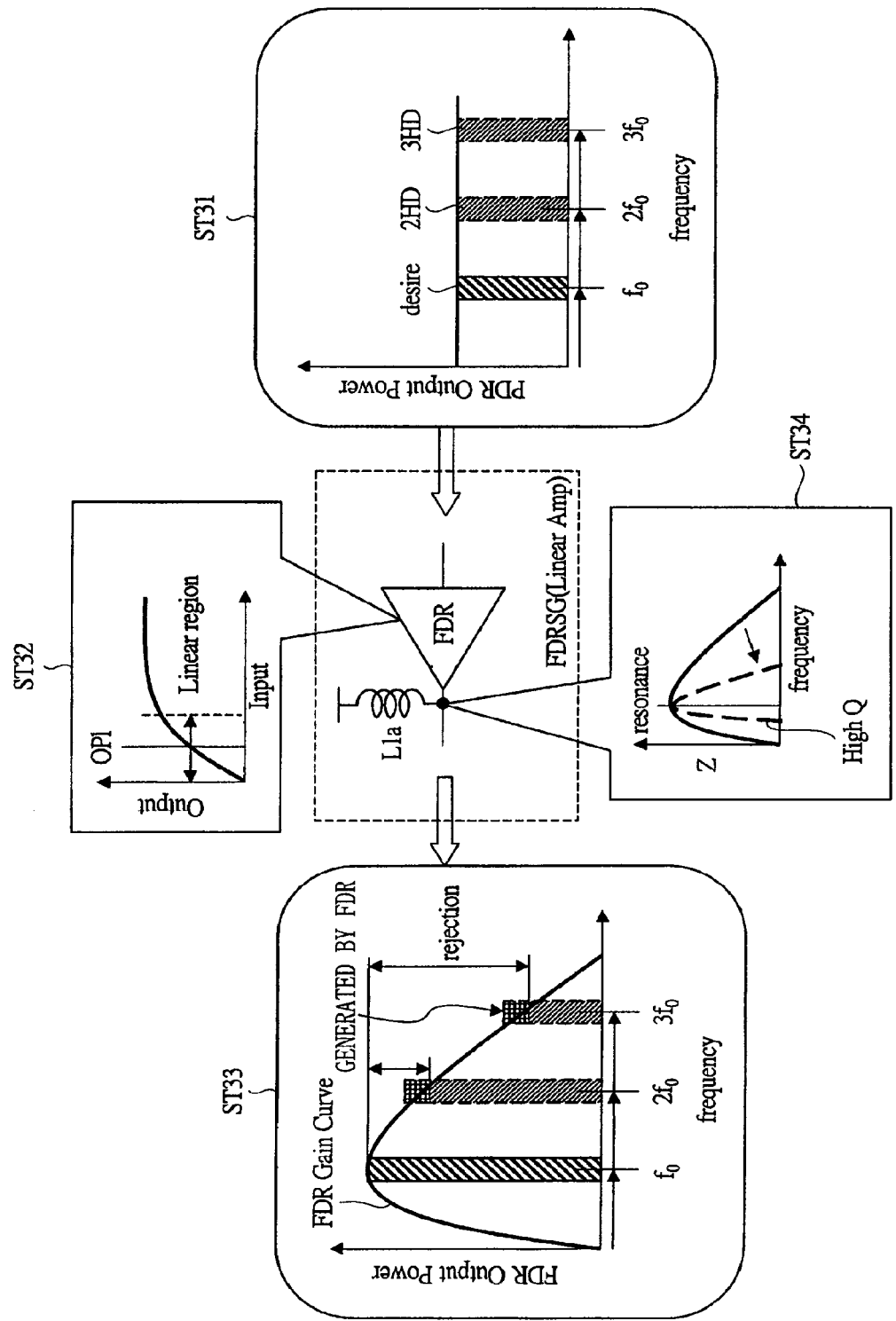
FIG. 3 is a conceptual diagram illustrating the operating principle of the final driver stage of the transmission block shown in FIG. 1.

FIG. 1 is a schematic circuit block diagram illustrating an example configuration of essential parts of a high-frequency signal processing device according to an embodiment of the present invention. FIG. 2 is a conceptual diagram illustrating the operating principle of the pre-driver stage PDRSG of a transmission block TXBK shown in FIG. 1. FIG. 3 is a conceptual diagram illustrating the operating principle of the final driver stage FDRSG of the transmission block TXBK shown in FIG. 1. FIG. 1 shows an example configuration of a transmission block TXBK section included in the high-frequency signal processing device RFIC. The transmission block TXBK is formed, for instance, over one semiconductor chip (e.g., a monolithic microwave integrated circuit (MMIC)) and includes an oscillation section OSCBK and a power amplifier section PABK.

The oscillation section OSCBK includes a voltage-controlled oscillator circuit VCO and a local buffer circuit LOBF, which is coupled downstream of the voltage-controlled oscillator circuit VCO to operate using an inductor L2$b$ as a load. The power amplifier section PABK includes a pre-driver stage PDRSG, which operates using the output of the local buffer circuit LOBF as an input, and a final driver stage FDRSG, which operates using the output of the pre-driver stage PDRSG as an input. The pre-driver stage PDRSG includes a pre-driver circuit PDR, which uses an inductor L1$b$ as a load and operates from a bias current limited by a current source ISS_LMT. The final driver stage FDRSG includes a final stage driver circuit FDR, which operates using an inductor L1$a$ as a load. The inductors L1$b$, L2$b$ are, for example, spiral inductors that are formed, for instance, by metal wiring over a semiconductor chip. The inductor L1$a$ is not always limited to, but may be, for example, an SMD (Surface Mount Device) or other part external to a semiconductor chip. The output of the final stage driver circuit FDR is coupled to an antenna ANT through an impedance matching circuit MACH, which is installed externally to a semiconductor chip together with the inductor L1$a$.

While the employed configuration is as described above, the high-frequency signal processing device according to the present embodiment is characterized in that the pre-driver circuit PDR, which performs a limiting operation, is disposed downstream of the oscillation section OSCBK, and that the final stage driver circuit FDR, which performs a linear amplification operation by using the inductor (L1$a$) having a high Q-value as a load, is disposed downstream of the pre-driver circuit PDR. Here, the inductor L1$a$ is used as an external part to implement an inductor having a high Q-value (e.g., a Q-value of several tens or more). However, if a high Q-value can be achieved by a semiconductor chip, the inductor L1$a$ can be incorporated into the semiconductor chip. The inductors (L1$b$, L2$b$) formed over a semiconductor chip of a silicon substrate or the like may actually exhibit a Q-value of less than ten.

The pre-driver circuit PDR performs a limiting operation on the principle shown, for instance, in FIG. 2. Firstly, a signal having a basic frequency $f_0$, which is input into the pre-driver circuit PDR from the oscillation section OSCBK, has a relatively large amplitude variation as indicated by the reference numeral ST21 in FIG. 2. A signal input into the pre-driver circuit PDR from the oscillation section OSCBK includes high-order harmonic distortion components (second-order harmonic distortion component (2HD) of 2$f_0$ and third-order harmonic distortion component (3HD) of 3$f_0$ in particular) in addition to the components of the basic frequency $f_0$. FIG. 4 shows examples of numerical values representing the amplitude variation of the oscillation section OSCBK shown in FIG. 1. As shown in FIG. 4, the oscillation section OSCBK may experience an overall amplitude variation of ±4 dB or more, including the variation of the voltage-controlled oscillator circuit VCO and the variation of the local buffer circuit LOBF.

The voltage-controlled oscillator circuit VCO may generally employ a method of controlling an oscillation frequency by changing the resonance frequency of an LC tank circuit, which includes an inductor (L) and a capacitor (C). However, when the resonance frequency of the LC tank circuit is changed, its Q-value also changes. Therefore, the voltage-controlled oscillator circuit VCO basically tends to experience a large variation. Further, as the voltage-controlled oscillator circuit VCO actually includes an amplifier circuit, it is affected, for instance, by production variation in transconductance gm. In addition, it also has a variation factor not included in a normal amplifier circuit, such as a MOS varactor capacitance that provides variable capacitance. As a result, it may experience a larger variation than when, for instance, an IQ modulation method based, for instance, on a mixer circuit is employed. Moreover, the variation experienced by the voltage-controlled oscillator circuit VCO may increase when the local buffer circuit LOBF is used. The local buffer circuit LOBF shown in FIG. 1 is also used by a reception block RXBK, which receives an oscillation signal from the voltage-controlled oscillator circuit VCO for the purpose of reducing the required area and power consumption. The local buffer circuit LOBF prevents the parasitic components (L, C) of the reception block RXBK from affecting the oscillation frequency of the voltage-controlled oscillator circuit VCO.

As described above, the output amplitude of the oscillation section OSCBK varies greatly. Therefore, the oscillation section OSCBK, the power amplifier section PABK installed downstream of the oscillation section OSCBK, or both of these sections require some countermeasures to be taken for reducing the transmission power variation to 0 dBm±3 dB. Further, if a signal input to the power amplifier section PABK is excessive due to variation, harmonic distortion (HD) occurs. Therefore, some countermeasures need to be taken against such harmonic distortion (HD). Consequently, an operating point OPs of the pre-driver circuit PDR is set within a saturation region as indicated by the reference numeral ST22 in FIG. 2 to let the pre-driver circuit PDR operate as a limiting amplifier. When the current of the current source ISS_LMT, which serves as a bias current source for the pre-driver circuit PDR, is IDD while the load impedance of the pre-driver circuit PDR is Z (=j$\omega$×L1$b$), the maximum output voltage amplitude Vout (max) of the limiting amplifier is limited to a value indicated by Equation (1). Meanwhile, if a linear amplifier is used, its output voltage amplitude Vout is as indicated by Equation (2), which uses an input voltage Vin and the transconductance gm of the amplifier. It means that the linear amplifier is affected by the variation in the transconductance gm unlike the limiting amplifier.

$$Vout(max) = IDD \times Z \qquad (1)$$

$$Vout = gm \times Z \times Vin \qquad (2)$$

In the saturation region, even if input power experiences a variation of Δin, the resulting output power is such that the variation of Δin is sufficiently compressed as indicated by the reference numeral ST22. As a result, the components of the basic frequency $f_0$ in the output power of the pre-driver circuit PDR are limited to a value corresponding to Vout (max) with the variation significantly reduced, as indicated by the reference numeral ST23. In other words, each input power having the basic frequency $f_0$ (the input power having three different variations in the present example), which is indicated by the reference numeral ST21, is handled so that the output power derived from the pre-driver circuit PDR is limited to a value corresponding to Vout (max) as indicated by the reference numeral ST23.

As described above, the use of the limiting amplifier (PDR) makes it possible to compress the input power variation and generate output power having a small variation. However, as indicated by the reference numeral ST23, an increase occurs in the high-order harmonic distortion components (second-order harmonic distortion component (2HD) and third-order harmonic distortion component (3HD) in particular) during an operation in the saturation region. Consequently, as indicated by the reference numeral ST32 in FIG. 3, an operating point OP1 of the final stage driver circuit FDR is defined within a linear region while the inductor L1$a$ having a high Q-value is used to operate the final stage driver circuit FDR as a linear amplifier.

For ease of explanation, it is now tentatively assumed, as indicated by the reference numeral ST31 in FIG. 3, that the frequency components ($f_0$, $2f_0$, $3f_0$) of the input power of the final stage driver circuit FDR (the output power of the pre-driver circuit PDR) have the same magnitude. Upon receipt of such input power, the final stage driver circuit FDR amplifies the individual frequency components at gains according to a frequency characteristic curve of impedance in the inductor L1$a$ (including its parasitic capacitance and parasitic resistance in reality) to generate output power, as indicated by the reference numerals ST33 and ST34. In this instance, the frequency characteristic curve becomes sharp-pointed with an increase in the Q-value of the inductor L1$a$ as indicated by the reference numeral ST34. Therefore, the gain for the basic frequency $f_0$ increases while the gains for the high-order frequencies ($2f_0$, $3f_0$, . . . ) decrease or substantially remain unchanged. Thus, the high-order harmonic distortion components (2HD, 3HD, . . . ) can be eliminated in accordance with the ratio between the gains for the basic and high-order frequencies. As indicated by the reference numeral ST33, the final stage driver circuit FDR also generates the high-order harmonic distortion components (the second-order harmonic distortion component of $2f_0$ and the third-order harmonic distortion component of $3f_0$ in particular). However, their magnitudes are remarkably smaller than during an operation in the saturation region because not only the Q-value of the inductor L1$a$ is high but also the final stage driver circuit FDR operates in a linear region.

In summary, as shown in FIG. 1, the pre-driver circuit PDR suppresses the amplitude variation (reference numeral ST11) in the basic frequency (desired frequency) components that occurs in the oscillation section OSCBK (reference numeral ST12), whereas the final stage driver circuit FDR suppresses the second-order and third-order harmonic distortion components (2HD and 3HD) increased in the pre-driver circuit PDR (reference numerals ST12 and ST13). As a result, the variation in the transmission power directed to the antenna ANT can be reduced, for instance, to 0 dBm±3 dB. In addition, the harmonic distortion (HD) can be reduced, for instance, to −47 dBm or less.

Here, it is assumed that the load inductor (L1$b$) for the pre-driver circuit PDR is a built-in inductor. In some cases, however, an external inductor may alternatively be used as the inductor L1$b$, as is the case with the inductor L1$a$. This alternative configuration makes it possible to slightly suppress the harmonic distortion components that are output from the pre-driver circuit PDR to the final stage driver circuit FDR. In reality, however, the harmonic distortion components generated in the pre-driver circuit PDR are sufficiently eliminated by the final stage driver circuit FDR without regard to the inductor type. On the whole, greater influence is exerted by the harmonic distortion components generated in the final stage driver circuit FDR. Thus, from the viewpoint, for instance, of cost and area, the use of a built-in inductor as the inductor L1$b$ will suffice.

<<Configuration and Operation of High-Frequency Signal Processing Device (Overall)>>

Figure 5:
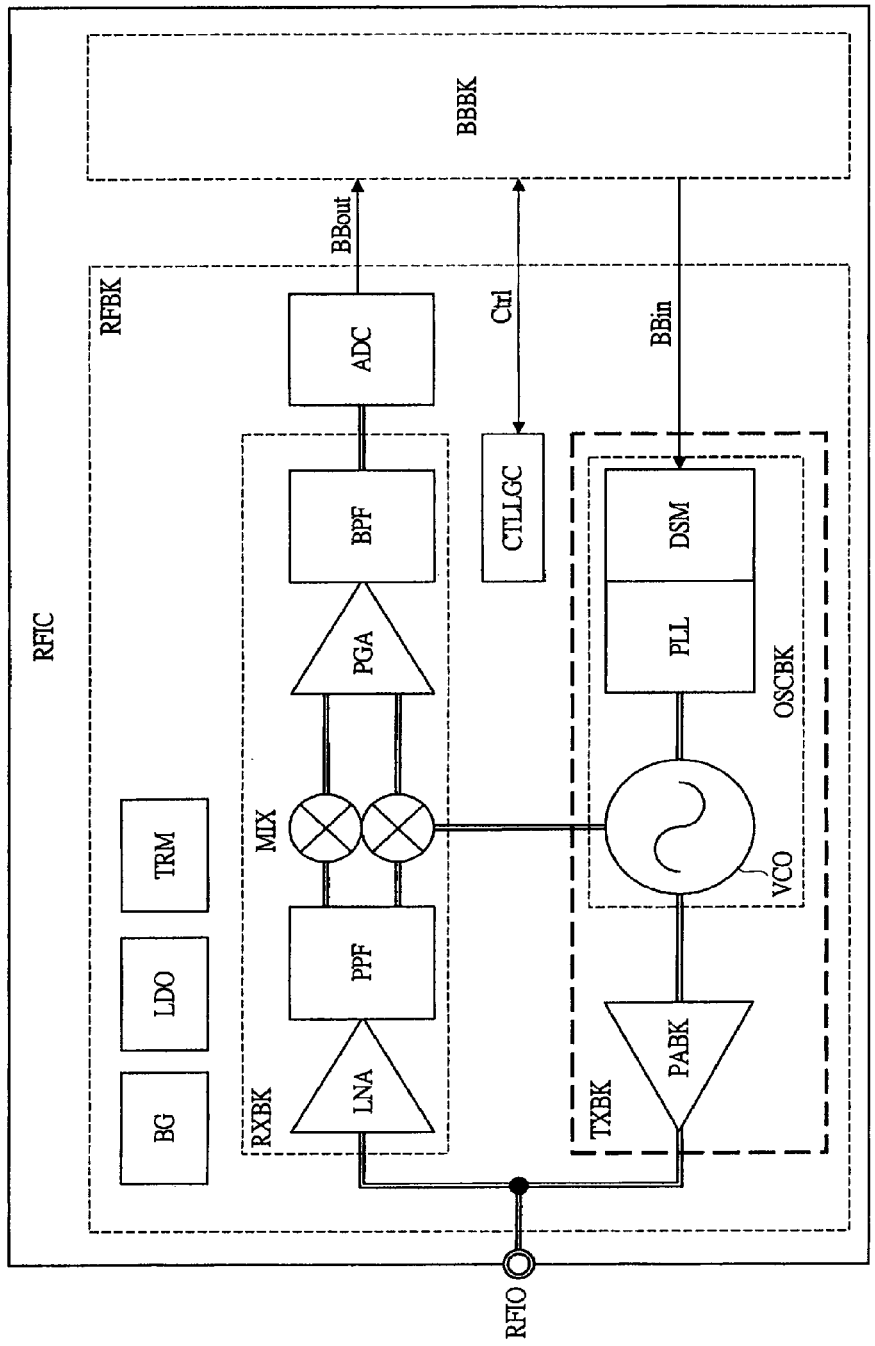
FIG. 5 is a schematic block diagram illustrating the overall configuration of the high-frequency signal processing device according to an embodiment of the present invention.

FIG. 5 is a schematic block diagram illustrating the overall configuration of the high-frequency signal processing device according to an embodiment of the present invention. The high-frequency signal processing device RFIC shown in FIG. 5 is implemented, for instance, by a semiconductor chip that includes a high-frequency block RFBK and a baseband block BBBK, and designed to perform a wireless communication operation in compliance with the ZigBee (registered trademark) standard. The baseband block BBBK includes a microcontroller unit (not shown) capable of executing a predetermined program, a memory for an operation of the microcontroller unit, and various peripheral units such as a timer circuit, and performs processes for various applications and various baseband processes for communication. The high-frequency block RFBK includes, for instance, a transmission block TXBK, a reception block RXBK, an analog-to-digital converter circuit ADC, a control logic circuit CTLLGC, a reference voltage generator circuit BG, a regulator circuit LDO, and a trimming circuit TRM.

The reference voltage generator circuit BG is a so-called bandgap reference circuit, and generates a reference voltage (or a reference current) that is not dependent on temperature or the like. The regulator circuit LDO uses the reference voltage (or the reference current) to generate various supply voltages and various constant currents for use in the high-frequency block RFBK. The trimming circuit TRM corrects production variation in various supply voltages and constant currents generated by the reference voltage generator circuit BG and the regulator circuit LDO. The transmission block TXBK includes an oscillation section OSCBK, which implements a direct modulation method, and a power amplifier section PABK, which is installed downstream of the oscillation section OSCBK. The aforementioned example configuration shown in FIG. 1 is applied to the transmission block TXBK. The control logic circuit CTLLGC controls various communications between the baseband block BBBK and the high-frequency block RFBK. The reception block RXBK includes a low-noise amplifier circuit LNA, a polyphase filter circuit PPF, a mixer circuit MIX, a variable-gain amplifier circuit PGA, and a bandpass filter circuit BPF.

Transmission and reception operations will now be summarized. At the time of transmission, the oscillation section OSCBK receives transmission baseband data BBin from the baseband block BBBK. In accordance with the received data, a frequency setup circuit (delta-sigma modulator circuit) DSM and a PLL circuit (PLL) control the LC resonant voltage-controlled oscillator circuit VCO to provide upconversion to a high-frequency band and modulation. More specifically, the frequency setup circuit DSM, for example, sets a PLL frequency division ratio to let a PLL loop to set the value of the varactor capacitance of the voltage-controlled oscillator circuit VCO. The oscillation frequency (basic frequency) $f_0$ of the voltage-controlled oscillator circuit VCO is then set, for instance, to 2.4 GHz. Subsequently, in the resulting state, the frequency setup circuit DSM couples predetermined capacitance to the voltage-controlled oscillator circuit VCO (or decouples predetermined capacitance from the voltage-controlled oscillator circuit VCO) in accordance with the transmission baseband data BBin and changes the PLL frequency division ratio to perform ±500 kHz or other modulation around 2.4 GHz. A modulated signal upconverted to a high-frequency band is amplified to desired transmission power in the power amplifier section PABK shown in FIG. 1, and then output to an external terminal RFIO. Subsequently, the signal is radiated from the antenna through the external impedance matching circuit.

At the time of reception, on the other hand, a received signal is input to the external terminal RFIO through the same antenna and impedance matching circuit as for transmission. The low-noise amplifier circuit LNA amplifies the received signal to a predetermined signal level with low noise. The polyphase filter circuit PPF generates an IQ differential four-phase signal from the output of the low-noise amplifier circuit LNA. The mixer circuit MIX downconverts the four-phase signal to a 2 MHz band by using a low IF oscillation signal from the voltage-controlled oscillator circuit VCO in the transmission block TXBK. Here, the voltage-controlled oscillator circuit VCO can be used for dual purposes because a TDD (Time Division Duplex) method is used. Image components included at the time of downconversion are canceled out by the polyphase filter circuit PPF and the bandpass filter circuit BPF. The variable-gain amplifier circuit PGA is also provided in order to pass the components of a basic frequency band to the analog-to-digital converter circuit ADC at an appropriate signal level. The analog-to-digital converter circuit ADC converts an input analog signal to a digital signal, and then outputs the digital signal to the baseband block BBBK as received baseband data BBout.

For the above-described ZigBee (registered trademark) system, which is typically employed for a wireless remote controller, the direct modulation method shown in FIG. 5 should preferably be used because there is a strong demand for downsizing and power consumption reduction. However, the use of the direct modulation method enlarges the amplitude variation caused by the oscillation section OSCBK as mentioned earlier. This makes it even more difficult to reduce transmission power variation and harmonic distortion (HD) in the power amplifier section PABK. Further, if the transmission block TXBK and the reception block RXBK share the voltage-controlled oscillator circuit VCO for downsizing and power consumption reduction, as shown in FIG. 5, it is preferred that the local buffer circuit LOBF be added as shown in FIG. 1. However, this addition of the local buffer circuit LOBF may enlarge the amplitude variation. As such being the case, the use of the example configuration shown in FIG. 1 is extremely beneficial.

<<Detailed Configuration of Power Amplifier Section>>

Figure 6:
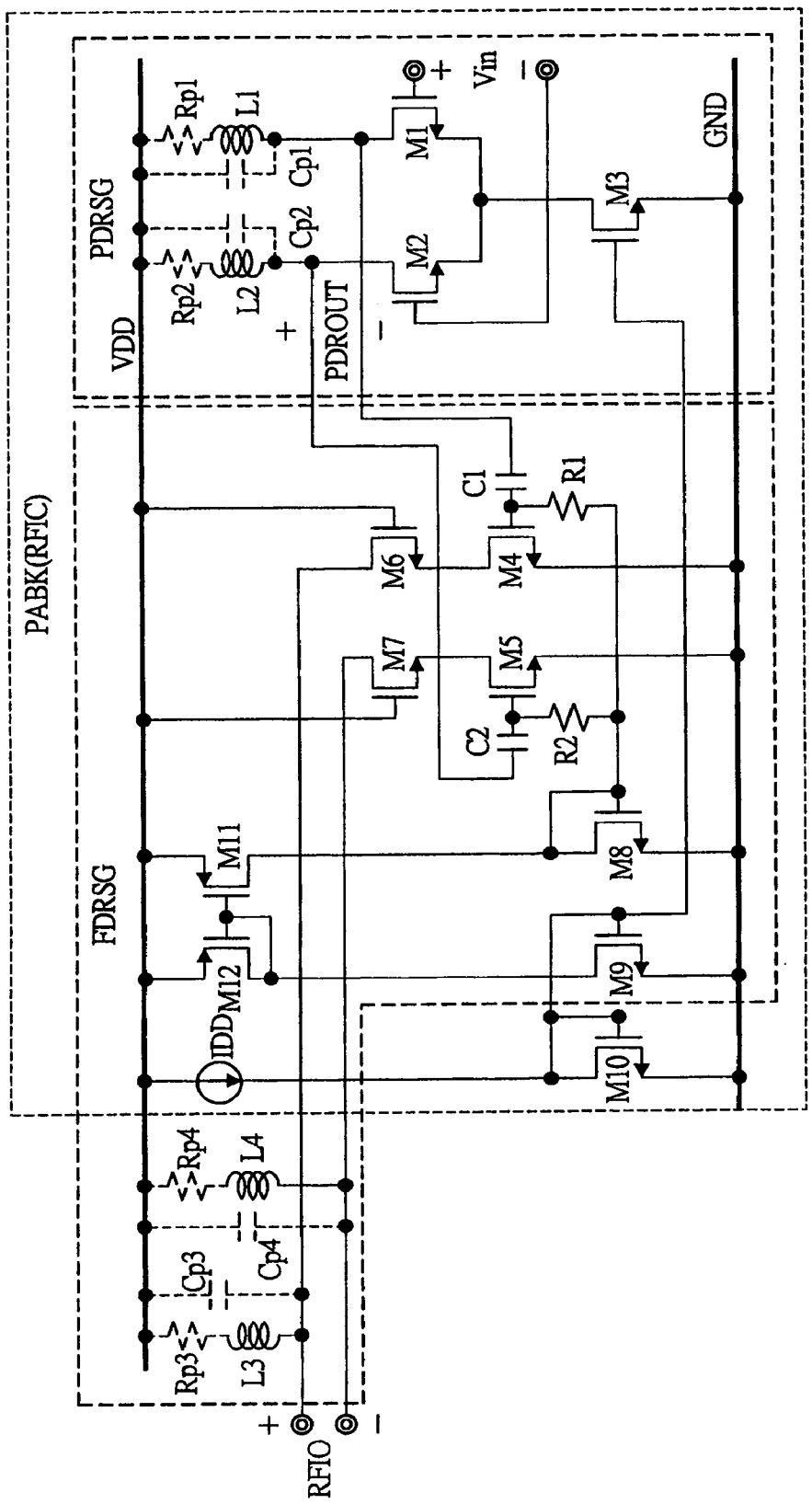
FIG. 6 is a circuit diagram illustrating in detail an example configuration of a power amplifier section in the transmission block shown in FIG. 1.

FIG. 6 is a circuit diagram illustrating in detail an example configuration of the power amplifier section PABK in the transmission block TXBK shown in FIG. 1. As shown in FIG. 6, the pre-driver stage PDRSG (pre-driver circuit PDR) is a differential amplifier circuit for an inductor load based on a tail current, whereas the final driver stage FDRSG (final stage driver circuit FDR) is a pseudo-differential cascode amplifier circuit. Capacitors Cp1-Cp4 and resistors Rp1-Rp4, which are indicated by broken lines in FIG. 6, are parasitic elements respectively included in inductors L1-L4.

The pre-driver stage PDRSG includes NMOS transistors M1, M2, which form a differential pair; an NMOS transistor M3, which is a tail current source coupled to a common source of the NMOS transistors M1, M2; and inductors L1 (CP1, Rp1), L2 (CP2, Rp2), which are inductor loads respectively coupled to the drains of the NMOS transistors M1, M2. The inductors L1 (CP1, Rp1), L2 (CP2, Rp2) correspond to the inductor L1b, which is shown in FIG. 1. The NMOS transistor M3 forms an NMOS transistor M10, to which a constant current IDD is supplied, and a current mirror circuit, and supplies a bias current to the NMOS transistors M1, M2 in accordance with a mirror ratio of M3:M10. Being configured as described above, the pre-driver stage PDRSG allows the NMOS transistors M1, M2 to receive a differential input signal Vin from the oscillation section, performs the aforementioned limiting operation, and generates a differential output signal PDROUT from the drains of the NMOS transistors M1, M2.

The final driver stage FDRSG includes NMOS transistors M4, M5, which form a pseudo-differential pair; NMOS transistors M6, M7, which serve as cascode stages for the NMOS transistors M4, M5; and inductors L3 (CP3, Rp3), L4 (CP4, Rp4), which serve as inductor loads for the NMOS transistors M6, M7 and correspond to the inductor L1a, which is shown in FIG. 1. The NMOS transistors M4, M5 are configured such that a bias current is supplied to them through a diode-coupled NMOS transistor M8 in order to prevent various characteristics, such as a gain, from changing due to an operating point shift that may be caused by Vth variation. The NMOS transistor M8 supplies the same bias current to the NMOS transistors M4, M5 as its gate (drain) is coupled to the gate of the NMOS transistor M4 through a resistor R1 and coupled to the gate of the NMOS transistor M5 through a resistor R2.

The current of the aforementioned NMOS transistor M10 is current-mirrored by an NMOS transistor M9. The resulting current is reflected by a current mirror circuit formed by PMOS transistors M12, M11, and then supplied to the NMOS transistor M8 through the PMOS transistor M11. The reason why the bias current is supplied from the NMOS transistor M10 to the NMOS transistors M4, M5 after being reflected by the PMOS transistors M12, M11 as described above without directly supplying the bias current is that the NMOS transistor M10 differs from the NMOS transistors M4, M5 in gate length Lg. In other words, the transistors M9-M12 having the same gate length Lg accurately set a current ratio in accordance with gate width Wg only so that the resulting current is supplied to the NMOS transistor M8, which has the same gate length Lg as the NMOS transistors M4, M5. As the above-described configuration is employed, the final driver stage FDRSG allows the NMOS transistors M4, M5 to receive the differential output signal PDROUT from the pre-driver stage PDRSG through DC cut capacitors C1, C2, performs the aforementioned linear amplification operation with the external inductors L3, L4, and outputs the resulting signal to the external terminal RFIO from the drains of the NMOS transistors M6, M7. The resistors R1, R2 are AC reduction high-resistance elements that prevent AC signals input through the capacitors C1, C2 from leaking into the gate (drain) of the NMOS transistor M8.

The use of the example configuration shown in FIG. 6, which is a differential configuration that ideally generates no even-ordered harmonic distortion components, makes it possible, firstly, to reduce the aforementioned second-order harmonic distortion components (2HD). Secondly, providing the final driver stage FDRSG with a cascode stage makes it possible to increase the gain and decrease the mirror capacity of the NMOS transistors M4, M5. This further makes it possible, for instance, to improve the frequency band and provide increased ease of impedance matching. In other words, as shown in FIG. 1, the impedance matching circuit MACH is installed downstream of the external terminal RFIO shown in FIG. 6. However, if the cascode stage is not installed, it is difficult to design the impedance matching circuit MACH because the external terminal RFIO (output) and the differential output signal PDROUT (input) are coupled together through, for example, the mirror capacitors of the NMOS transistors M4, M5. On the other hand, if the cascode stage is installed, the design of the impedance matching circuit MACH can be facilitated because the isolation between the above-mentioned input and output can be increased.

FIG. 7 shows a design example indicative of the size (gate length Lg and gate width Wg) and source-drain current (bias current) IDS of each transistor in the power amplifier section PABK shown in FIG. 6. As shown in FIG. 7, the size (gate width Wg) of the NMOS transistors M1, M2 is less than half the size of the NMOS transistors M4, M5. Further, the source-drain current (bias current) IDS of the NMOS transistors M1, M2 is approximately one order of magnitude smaller than that of the NMOS transistors M4, M5. As described above, the pre-driver circuit PDR is designed to have a smaller bias current and transistor size than the final stage driver circuit FDR in order to perform a limiting operation and exhibit a small transconductance gm (and unit gate size) relative to input power. The transconductance gm of the NMOS transistors M1, M2 is designed to be, for example, not more than half the transconductance gm of the NMOS transistors M4, M5 (designed to be approximately 1/4.8 in the present example). Further, to allow the amplitude of the differential output signal PDROUT corresponding to the input voltage Vin to be limited by a bias current IDS, the pre-driver circuit PDR is designed so that (gm×Vin)/IDS>>1 (approximately 4.1 in the present example). Furthermore, the gate length Lg of the transistors M3, M9-M12 is designed to be greater than that of the transistors M1, M2, M4-M8. The reason is that the greater the gate length Lg, the smaller the relative size variation among the transistors, the higher the current accuracy of the current mirror circuit.

<<Various Electrical Characteristics of Power Amplifier Section>>

Figure 8:
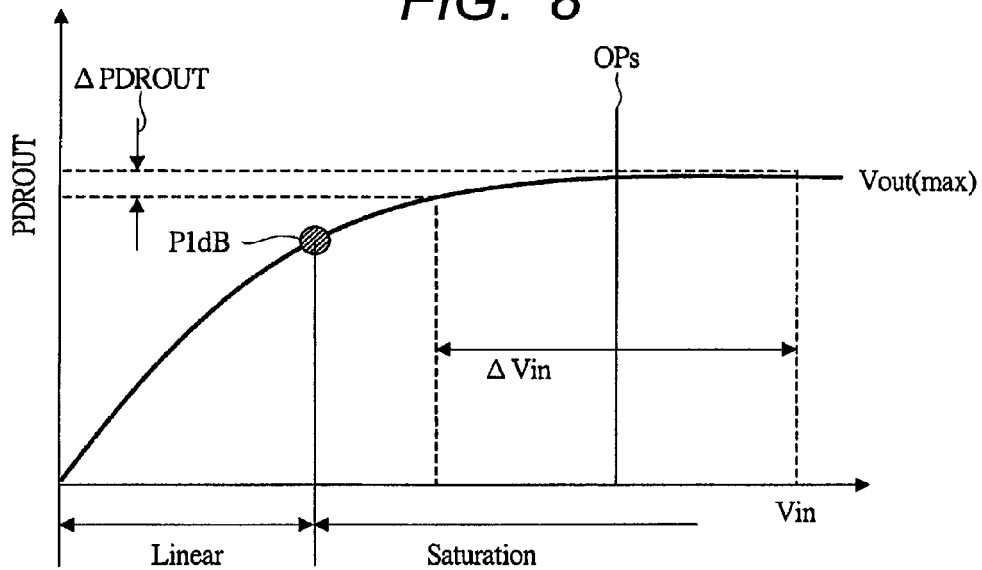
FIG. 8 is a graph showing exemplary input/output characteristics of the pre-driver stage shown in FIG. 6.

FIG. 8 is a graph showing exemplary input/output characteristics of the pre-driver stage PDRSG shown in FIG. 6. In FIG. 8, the horizontal axis indicates an input voltage (input power), which is the input voltage Vin shown in FIG. 6, whereas the vertical axis indicates an output voltage (output power), which is the differential output signal PDROUT shown in FIG. 6. The input/output characteristics shown in FIG. 8 can be divided into a linear region and a saturation region in accordance with input. A point P1dB provides the boundary between the two regions. The point P1dB is called, for example, a 1 dB gain compression point. It denotes a point at which the gain is 1 dB lower than the gain of the linear region (i.e., a point at which the actual output is 1 dB lower than an output that is obtained when the output is supposed to increase linearly relative to the input). In general, analog amplifier circuits use a linear region. However, the pre-driver stage PDRSG (pre-driver circuit PDR) shown in FIG. 6 positively uses the saturation region to suppress the amplitude variation of the oscillation section OSCBK, thereby suppressing the transmission power variation of the direct modulation method. As is obvious from FIG. 8, when an operating point OPs is set a voltage higher than that at the point P1dB, the output variation relative to the input variation is suppressed (ΔPDROUT<ΔVin). The bias current for the NMOS transistor M3 shown in FIG. 6 is sufficiently decreased in order to operate the pre-driver circuit PDR at this operating point OPs. However, when the pre-driver circuit PDR operates at this operating point, a problem of harmonic distortion arises.

Figure 9:
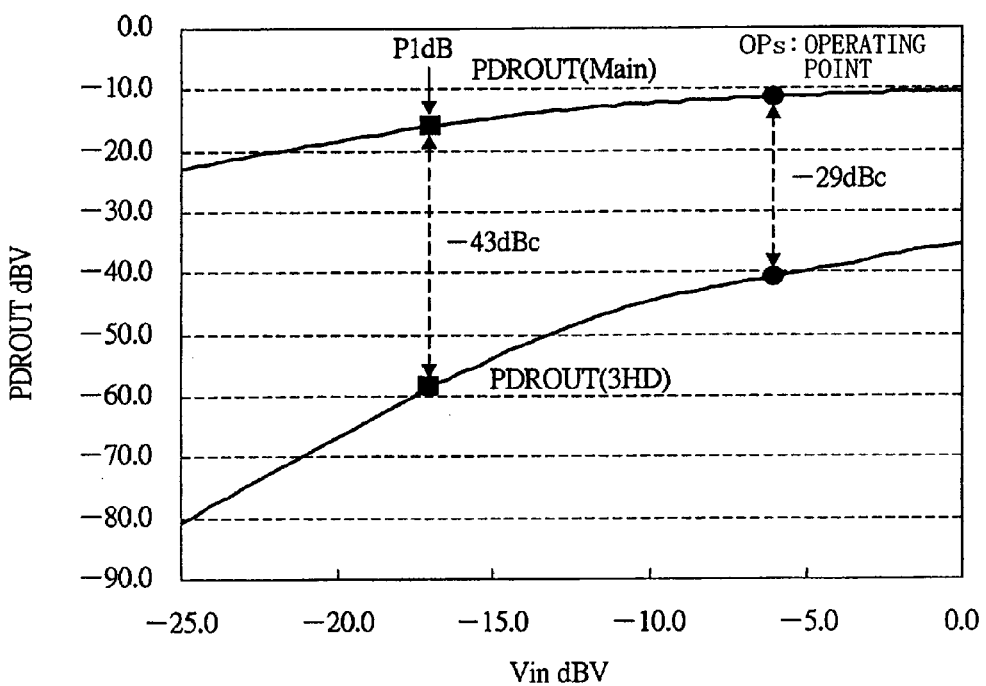
FIG. 9 shows the results of a simulation performed to verify changes in the main and third-order harmonic distortion components of the output voltage level of the pre-driver stage shown in FIG. 6 that were caused by input voltage level changes.

FIG. 9 shows the results of a simulation performed to verify changes in the main and third-order harmonic distortion components of the output voltage level (PDROUT) of the pre-driver stage PDRSG shown in FIG. 6 that were caused by changes in the input voltage level (Vin). As is obvious from FIG. 9, when an operation is performed near the point P1dB, the level difference between a main signal (PDROUT (main)) and the third-order harmonic distortion component (PDROUT (3HD)) is −43 dBc; however, when the operation is performed at the operating point OPs, the level difference is reduced to −29 dBc. As described above, the harmonic distortion components increase when an attempt is made to suppress the variation relative to the input voltage level Vin. It means that there is a trade-off between a decrease in the variation relative to the input voltage level Vin and a decrease in the amount of harmonic distortion components. Further, if the differential output signal PDROUT at the operating point OPs shown in FIG. 9 is amplified in such a manner that the main signal is 0 dBm at the external terminal RFIO shown in FIG. 6 on the presumption that a harmonic level having a different frequency is amplified by the same gain as the main signal, it is anticipated that the amplified harmonic level may exceed a target of −47 dBm. Therefore, it is necessary that countermeasures against harmonics be taken by the downstream final stage driver circuit FDR.

As shown in FIG. 6, the amplifier circuit that uses the external inductors L3, L4 having a high Q-value as the loads is employed as the final stage driver circuit FDR in order to reduce the influence of harmonic distortion as much as possible. If, as shown in FIG. 6, an inductor equivalent circuit is considered as a combination of serially coupled pure inductance L, parasitic resistance Rp, and parasitic capacitance Cp coupled parallel to the pure inductance L and the parasitic resistance Rp, the Q-value and impedance Z prevailing at an inductor resonance frequency are as indicated by Equations (3) and (4) below. As the equations imply that the higher the Q-value, the higher the impedance of an inductor (or an LC tank) at the resonance frequency. Therefore, when an inductor having a high Q-value is used as a load for the amplifier circuit, it can be expected that the harmonics on the main signal will be successfully suppressed.

$$Q = \frac{1}{R_p}\sqrt{\frac{L}{C_p}} \quad (3)$$

$$|Z| = \frac{\sqrt{\left(\frac{L}{C_p}\right)^2 + \left(\frac{R_p}{\omega C_p}\right)^2}}{\sqrt{R_p^2 + \left(\omega L - \frac{1}{\omega C_p}\right)^2}} \quad (4)$$

Figure 10:
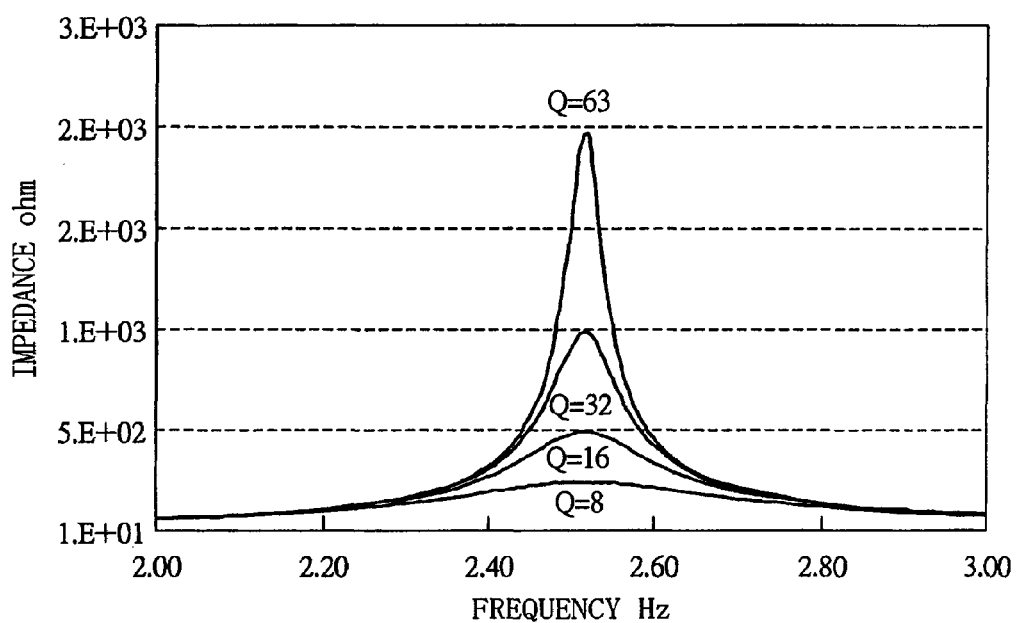
FIG. 10 relates to an inductor having a resonance frequency of approximately 2.4 GHz and shows exemplary frequency characteristics of impedance that prevail when the inductor's Q-value is changed.

FIG. 10 relates to an inductor having a resonance frequency of approximately 2.4 GHz and shows exemplary frequency characteristics of impedance that prevail when the inductor's Q-value is changed. The impedance of the inductor is maximized at a resonance frequency that is determined by √(LC). When the inductor is used as a load for the amplifier circuit, adjustments are made so that the main signal frequency is equal to the resonance frequency to increase the degree of main signal amplification. As shown in FIG. 10, the impedance at the resonance frequency increases with an increase in the Q-value; however, the impedance does not substantially increase at a frequency other than the resonance frequency. Therefore, when an inductor having a high Q-value is used as a load for the amplifier circuit, it is possible to increase an out-of-band rejection ratio, that is, the difference between the main signal and the harmonic distortion components, which are collaterally generated due to the nonlinearity of the amplifier circuit.

For example, the Q-value of a silicon on-chip inductor tends to be lower than that of an external inductor due to the limitation, for instance, of the inductor's metal layer resistance value. In the example shown in FIG. 6, therefore, external inductors (L3, L4) are used. When, for example, an external inductor formed, for instance, over a ceramic substrate is used, a Q-value of approximately 63 can be achieved. When, on the other hand, a silicon on-chip inductor is used, the maximum achievable Q-value may be as low as approximately 8. In the case of the final stage driver circuit FDR show in FIG. 6, the high rejection ratio of the inductors L3, L4 relative to an out-of-band region is utilized to suppress the harmonic level of the differential output signal PDROUT generated at the operating point OPs shown in FIG. 9 for the purpose of preventing the harmonic level developed at the external terminal RFIO shown in FIG. 6 from exceeding a target level.

Figure 11:
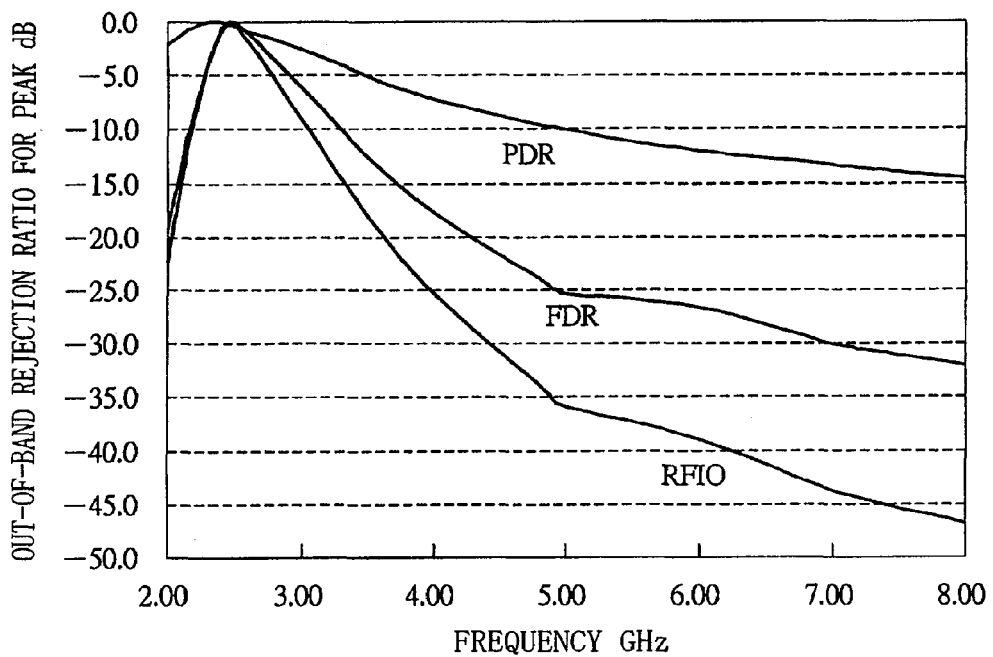
FIG. 11 shows exemplary results obtained when the stage-specific and overall frequency characteristics of the power amplifier section shown in FIG. 6 were verified.

FIG. 11 shows exemplary results obtained when the stage-specific and overall frequency characteristics of the power amplifier section PABK shown in FIG. 6 were verified. In FIG. 11, the horizontal axis indicates the frequency (GHz), whereas the vertical axis indicates the out-of-band rejection ratio (dB). The range of the vertical axis is normalized on an individual result basis by the maximum output power corresponding to the peak of frequency characteristics. The pre-driver stage PDRSG (pre-driver circuit PDR) is verified by observing the output (PDROUT) relative to its input (Vin). The final driver stage FDRSG (final stage driver circuit FDR) is verified by isolating the circuit at the output PDROUT and applying a new input signal to the output PDROUT. As is obvious from FIG. 11, the out-of-signal-band rejection ratio of the final stage driver circuit FDR is higher than that of the pre-driver circuit PDR. In other words, it is obvious that the power amplifier section PABK is capable of considerably suppressing the harmonic level prevailing at the output (PDROUT) of the pre-driver circuit PDR. Further, it is obvious that the out-of-signal-band harmonic distortion input to the input (Vin) shown in FIG. 6 (i.e., the harmonic distortion generated in the oscillation section OSCBK shown, for instance, in FIG. 1) is suppressed by the greatest degree because the rejection ratios of both the pre-driver circuit PDR and the final stage driver circuit FDR are applied as indicated at the external terminal RFIO (corresponding to the entirety) shown in FIG. 11.

Due to the rejection ratio of the final stage driver circuit FDR shown in FIG. 11, the difference between the power level of the main signal having a frequency of 2.4 GHz and the power level prevailing in the vicinity of a third-order harmonic having a frequency of 7.2 GHz is approximately −30 dBc. It means that a 30 dBc suppression effect is produced even if a great harmonic generated by the upstream pre-driver circuit PDR is input into the input of the final stage driver circuit FDR. If, for instance, the output of the pre-driver circuit PDR at the operating point OPs shown in FIG. 9 is input into the final stage driver circuit FDR to let the external terminal RFIO output the main signal at 0 dBm, the harmonic level appearing at the external terminal RFIO is −59 dBm (0 dBm−29 dBc−30 dBc=−59 dBm). It is sufficiently acceptable as it is lower than a target level of −47 dBm. In reality, however, the actual value is greater than −59 dBm because the harmonic generated in the final stage driver circuit FDR is not taken into account. As the current consumption of the final stage driver circuit FDR should be minimized, the characteristics of the entire circuit are adjusted while considering the trade-off between the current consumption and distortion.

Figure 12:
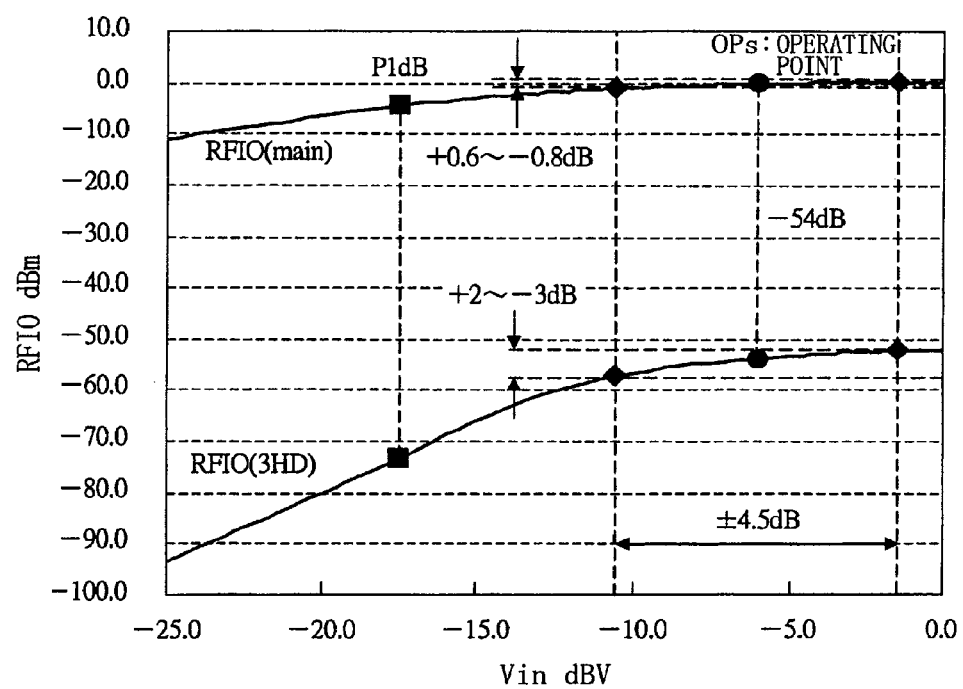
FIG. 12 shows exemplary results obtained when the overall input/output characteristics of the power amplifier section shown in FIG. 6 were verified.

FIG. 12 shows exemplary results obtained when the overall input/output characteristics (the output (RFIO) relative to the input (Vin)) of the power amplifier section PABK shown in FIG. 6 were verified. The point P1dB in FIG. 12 is determined by the compression of the pre-driver circuit PDR shown in FIG. 9. Obviously, however, the ratio at the operating point OPs between the third-order harmonic (RFIO (3HD)) and the main signal (RFIO (main)) is improved to −50 dBc or better due to the effect of an inductor that belongs to the final stage driver circuit FDR and has a high Q-value. An ideal calculated value, which is determined only by the distortion of the pre-driver circuit PDR without considering the distortion of the final stage driver circuit FDR, is −59 dBm as mentioned earlier. Meanwhile, FIG. 12 indicates a value of −54 dBm, which is greater than the ideal calculated value. It means that the final stage driver circuit FDR has contributed to the distortion. However, as the input amplitude for the final stage driver circuit FDR is limited by a limiting operation, the third-order harmonic level does not rise and remains substantially constant even if the input level shown in FIG. 12 is raised above the operating point OPs.

Even if the amplitude variation in the oscillation section OSCBK is approximately ±4.5 dB (Δ9 dB) as shown in FIG. 4, the variation of the main signal (RFIO (main)) relative to the output (RFIO) in the vicinity of the operating point OPs is within the range between +0.6 dB and −0.8 dB (Δ1.4 dB) as shown in FIG. 12. Therefore, even if the amplitude varies in the oscillation section OSCBK, the use of the example configurations shown in FIGS. 1 and 6 makes it possible to reduce the transmission power variation.

<<Comparative Example of High-Frequency Signal Processing Device (Essential Parts)>>

Figure 13:
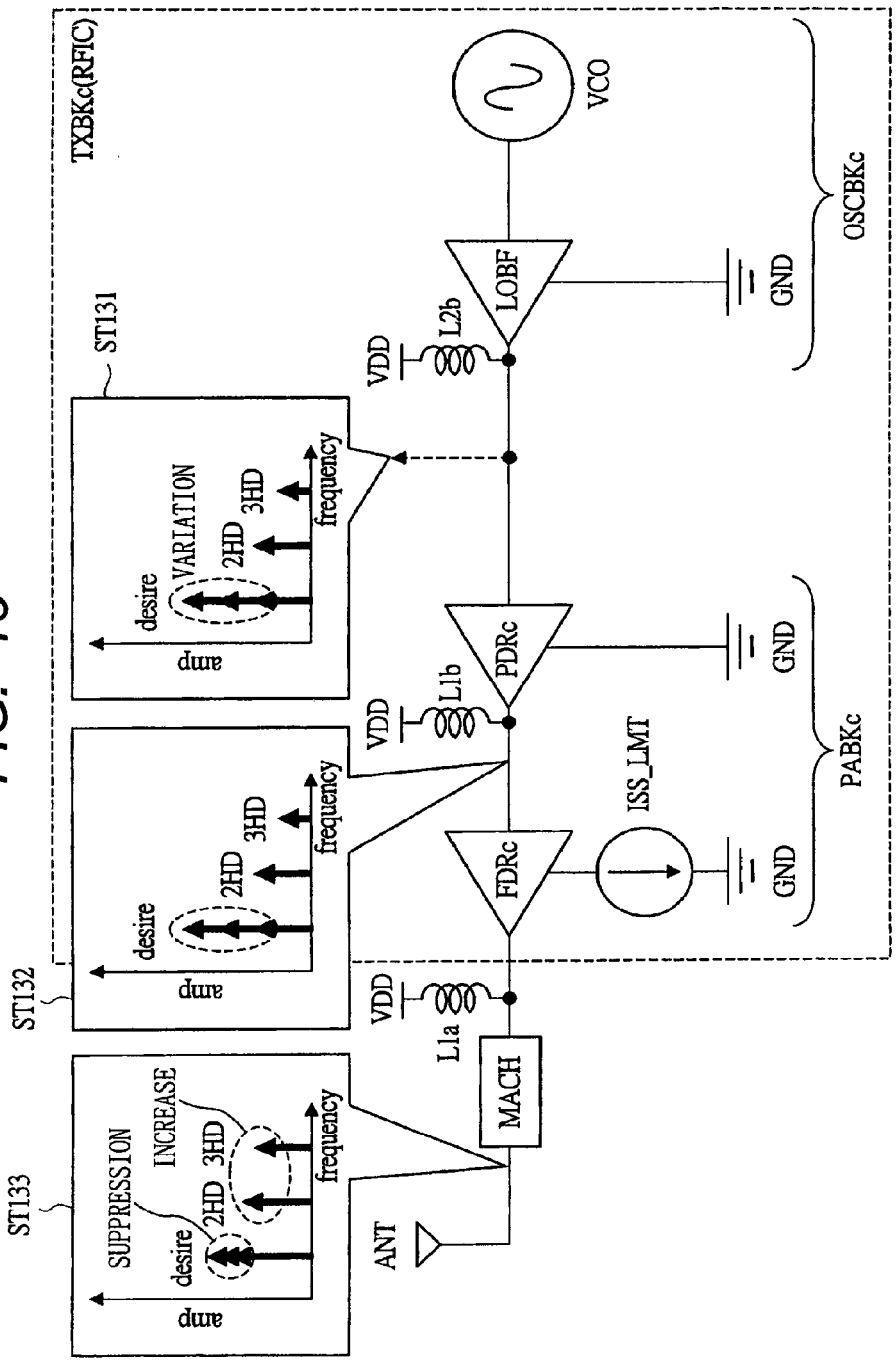
FIG. 13 is a schematic circuit block diagram illustrating an example configuration of essential parts of a high-frequency signal processing device that was studied as an example of comparison with the device shown in FIG. 1.

FIG. 13 is a schematic circuit block diagram illustrating an example configuration of essential parts of a high-frequency signal processing device that was studied as an example of comparison with the device shown in FIG. 1. Unlike the transmission block TXBK shown in FIG. 1, a transmission block TXBKc shown in FIG. 13 is configured so that an upstream pre-driver circuit PDRc is a linear amplifier that uses a built-in inductor L1b as a load, and that a downstream final stage driver circuit FDRc is a limiting amplifier that uses an external inductor L1a as a load. If the circuit configuration of the pre-driver stage PDRSG shown in FIG. 6 is used to let the final stage driver circuit FDRc shown in FIG. 13 perform a limiting operation, it is obvious that the amount of out-of-band rejection ratio improvement achieved when the built-in inductor L1b is replaced by the external inductor L1a having a high Q-value is approximately −16 dBc in the vicinity of a frequency of 7.2 GHz in FIG. 11.

Figure 14:
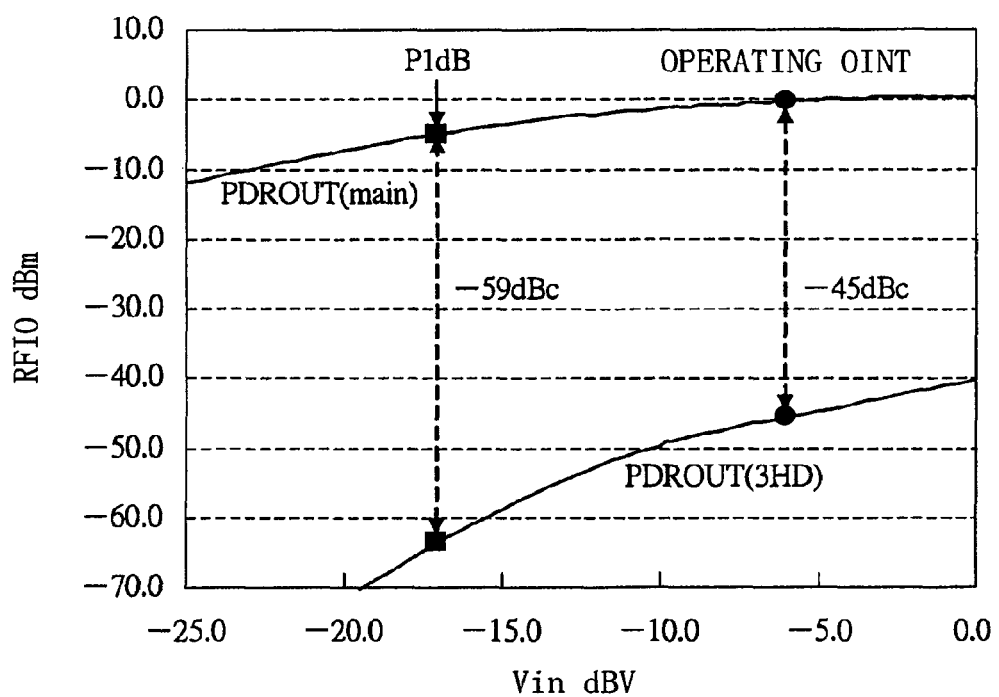
FIG. 14 shows exemplary results obtained when the overall input/output characteristics of the power amplifier section shown in FIG. 13 were verified.

Next, if the final stage driver circuit FDRc shown in FIG. 13 is designed to have an output saturation power of 0 dBm without changing its input compression level so that it has the same limiting characteristics as the pre-driver circuit PDR shown in FIG. 9, the input/output characteristics of the final stage driver circuit FDR are as shown in FIG. 14. The rejection ratio at the operating point shown in FIG. 14 is −45 dBc, which is obtained when the amount of out-of-band rejection ratio improvement (−16 dBc) achieved by the aforementioned inductor having a high Q-value is applied to −29 dBc in FIG. 9. Therefore, when an attempt is made to generate an output of 0 dBm, the harmonic level appearing at the output is −45 dBm, which is determined by the rejection ratio of the final stage driver circuit FDR relative to the main signal, even if it is presumed that no distortion occurs in the linearly operating pre-driver circuit PDRc. In other words, in the example configuration shown in FIG. 1, the harmonic distortion generated by the limiting amplifier (PDR) is suppressed in accordance with the out-of-band rejection ratios provided by the load inductors of both the pre-driver circuit PDR and the final stage driver circuit FDR. In the example configuration shown in FIG. 13, on the other hand, the harmonic distortion generated by the limiting amplifier (FDRc) is suppressed in accordance with only the out-of-band rejection ratio provided by the load inductor L1a of the final stage driver circuit FDRc. Hence, the example configuration shown in FIG. 1 is more beneficial than the example configuration shown in FIG. 13 from the viewpoint of distortion suppression.

While the present invention contemplated by its inventors has been described in terms of a preferred embodiment, it should be understood by those skilled in the art that the invention is not limited to the preferred embodiment, but extends to various modifications that nevertheless fall within the spirit and scope of the invention.

For example, the present invention has been described on the assumption that it is applied to the ZigBee (registered trademark) system. However, the present invention is not limited to such a system. The present invention can also be applied as means for reducing the transmission power variation and harmonic distortion of a wireless communication system that provides phase modulation or frequency modulation instead of amplitude modulation.

What is claimed is:

1. A high-frequency signal processing device comprising:
   a first amplifier circuit which operates in a saturation region where output power is higher than at a 1 dB gain compression point, receives a first input signal, which is phase-modulated or frequency-modulated, and amplifies power by using a first inductor as a load;
   a second amplifier circuit which operates in a linear region where output power is lower than at the 1 dB gain compression point, receives a second input signal, which is output from the first amplifier circuit, and amplifies power by using a second inductor as a load, the second inductor having a higher Q-value than the first inductor;
   an LC resonant oscillator circuit,
   wherein the first input signal is generated when an LC component of the LC resonant oscillator circuit is modulated in accordance with transmission data;
   a mixer circuit that downconverts a third input signal by using a local oscillation signal; and
   a buffer circuit that is disposed downstream of the LC resonant oscillator circuit,
   wherein the LC resonant oscillator circuit outputs the first input signal to the first amplifier circuit through the buffer circuit at the time of transmission, and outputs the local oscillation signal to the mixer circuit through the buffer circuit at the time of reception.

2. The high-frequency signal processing device according to claim 1,
   wherein the first inductor, the first amplifier circuit, the second amplifier circuit, and the oscillator circuit are formed over one semiconductor chip, and
   wherein the second inductor is disposed externally to the semiconductor chip.

3. The high-frequency signal processing device according to claim 1,
   wherein the high-frequency signal processing device operates in compliance with the ZigBee (registered trademark) standard.

4. A high-frequency signal processing device comprising:
   a first amplifier circuit which operates in a saturation region where output power is higher than at a 1 dB gain compression point, receives a first input signal, which is phase-modulated or frequency-modulated, and amplifies power by using a first inductor as a load;
   a second amplifier circuit which operates in a linear region where output power is lower than at the 1 dB gain compression point, receives a second input signal, which is output from the first amplifier circuit, and amplifies power by using a second inductor as a load, the second inductor having a higher Q-value than the first inductor; and
   an LC resonant oscillator circuit,
   wherein the first input signal is generated when an LC component of the LC resonant oscillator circuit is modulated in accordance with transmission data, and
   wherein the first and second amplifier circuits have a differential configuration.

5. The high-frequency signal processing device according to claim 4,
   wherein the second amplifier circuit includes a cascode stage.

* * * * *